United States Patent
Liao et al.

(10) Patent No.: US 6,388,009 B1
(45) Date of Patent: May 14, 2002

(54) CARBOXYL OR ANHYDRIDE-FUNCTIONAL STYRENE/P-ALKYLSTYRENE COPOLYMER, EPOXY RESIN AND CURING AGENT

(75) Inventors: Wei-Han Liao; Hsien-Yin Tsai; In-Mau Chen, all of Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/448,695

(22) Filed: Nov. 24, 1999

(51) Int. Cl.⁷ .......................... B32B 17/04; C08K 7/14; C08L 25/16; C08L 63/02; C08L 63/04
(52) U.S. Cl. .................. 525/113; 428/297.4; 523/428; 523/434; 523/439; 523/467; 525/114
(58) Field of Search ................................. 525/113, 114; 523/428, 434, 439, 467; 428/297.4

(56) References Cited

U.S. PATENT DOCUMENTS

| 5,089,343 A | * | 2/1992 | Colborn et al. ............. 428/416 |
| 5,141,791 A | * | 8/1992 | Chao et al. .................. 428/209 |
| 5,436,397 A | * | 7/1995 | Okada et al. ................ 525/208 |
| 5,543,484 A | * | 8/1996 | Chung et al. ............. 526/347.1 |
| 6,180,725 B1 | * | 1/2001 | Tsai et al. .................... 525/404 |

* cited by examiner

*Primary Examiner*—Robert E. L. Sellers
(74) *Attorney, Agent, or Firm*—Darby & Darby

(57) ABSTRACT

A low dielectric constant composition used in electric circuit boards is disclosed. The composition includes (a) 20–99.9 parts by weight of a functionalized syndiotactic styrene/para-alkystyrene copolymer having microfoaming when being cured; (b) 0.01–80 parts by weight of a mixture of epoxy resins; and (c) less than 50 parts by weight of a curing agent.

15 Claims, No Drawings

CARBOXYL OR ANHYDRIDE-FUNCTIONAL STYRENE/P-ALKYLSTYRENE COPOLYMER, EPOXY RESIN AND CURING AGENT

BACKGROUND OF THE INVENTION

1. Field of the Invention

The present invention relates to a resin composition constituting the laminate for electric circuit boards and a laminate comprising such a resin composition. More particularly, it relates to a resin composition for reducing the dielectric constant and increasing the solvent resistance of electric circuit boards and a laminate comprising such a resin composition.

2. Description of the Related Arts

To improve the high dielectric constant of the epoxy resin (the $D_k$ is 4.5 at 1 GHz after impregnating a glass cloth), the epoxy resin is mixed with polyphenylene oxide (PPO; $D_k$ is 2.7 at 1 GHz) so that the dielectric constant of the electric circuit boards made thereof can be decreased ($D_k$ is 4.0 at 1 GHz). Although the dielectric constant is decreased by using this method, the solvent resistance and high temperature resistance of electric circuit boards are sacrificed.

Syndiotactic polystyrene (sPS) has the properties of high melting point, low specific gravity, and excellent chemical resistance, which make it very useful in many applications. Since the raw material of sPS, i.e., styrene monomer, is very cheap, and its dielectric constant ($D_k$ is 2.4 at 1 GHz) is similar to polytetrafluoroethylenes resin (PTFE; $D_k$ is 2.2 at 1 GHz), sPS has the potential for developing electric circuit boards. Nowadays, the material used for making high frequency electric circuit substrates is generally PTFE or PPO. See for example, U.S. Pat. Nos. 4,853,423, 5,043,367 and 5,308,565. However, PTFE is relatively expensive (>US$ 20/kg) and difficult in processing; PPO has poor solvent resistance (the solvent resistance is necessary for the cleaning of electric circuit boards). Thus, the present invention aims to replace PTFE or PPO with functionalized-sPS (f-sPS) in order to increase solvent resistance while maintaining the low dielectric constant for making electric circuit substrates.

SUMMARY OF THE INVENTION

It is therefore an object of the present invention to provide a resin composition constituting the laminate for an electric circuit board which has high solvent resistance, high temperature resistance and excellent dielectric properties, and which is inexpensive.

Another object of the present invention is to provide a laminate for an electric circuit board comprising such a resin composition.

To attain the above objects, the resin composition in accordance with the present invention is co-polymerized with a functionalized syndiotactic polystyrene-based copolymer which has microfoaming when being cured and a mixture of epoxy resins. The microfoaming of the f-sPS contributes to the decrease of the dielectric constant.

DETAILED DESCRIPTION OF THE INVENTION

The resin composition according to the present invention comprises: (a) 20–99.9 parts by weight of a functionalized syndiotactic polystyrene-based copolymer having microfoaming when being cured; (b) 0.01–80 parts by weight of a mixture of epoxy resins; and (c) less than 50 parts by weight of a curing agent.

In the resin composition according to the present invention, a functionalized syndiotactic polystyrene-based copolymer having microfoaming when being cured is employed as the component (a). Especially preferred are functionalized syndiotactic styrene/para-alkylstyrene copolymers. Illustrative of such copolymers include oxidized styrene/para-methylstyrene copolymer, halogenated syndiotactic styrene/para-methylstyrene copolymer, carboxylated styrene/para-methylstyrene copolymer, metallized styrene/para-methylstyrene copolymer, aminated styrene/para-methylstyrene copolymer or silylated styrene/para-methylstyrene copolymer. The molecular weight of the functionalized syndiotactic polystyrene-based copolymer to be used in the present invention is preferably within the range of $1 \times 10^4$ to $5 \times 10^5$ in terms of weight-average molecular weight.

The general process for preparing the functionalized syndiotactic styrene-based copolymer of the present invention will be described below. Taking the reaction of styrene and para-methylstyrene monomers as an example, the two monomers are co-polymerized by using a metallocene catalyst. The catalyst system may also include an activating cocatalyst such as methyl aluminoxane (MAO).

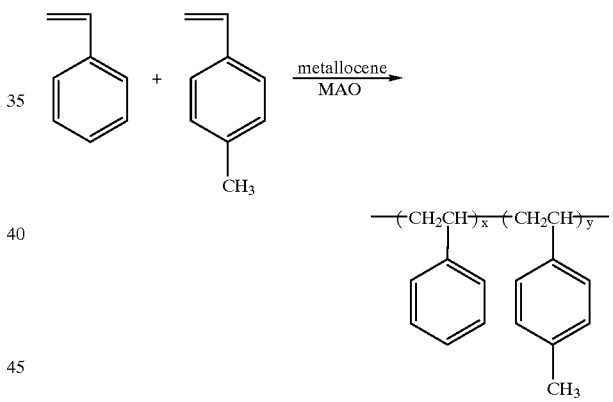

wherein x and y are the molar ratio of the respective monomer, and x+y=100.

Suitable metallocene catalysts have a delocalized τ-bonded moiety with a constrained geometry. The catalysts may be further described as a metal coordination complex comprising a IVB–VIB Groups metal and a delocalized τ-bonded moiety with a constrained geometry. In this regard, references are made to U.S. Pat. Nos. 4,542,199; 4,530,914; 4,665,047; 4,752,597; 5,026,798; and 5,272,236. Preferred catalyst complexes include zirconocene and titanocene coordination compounds with single or double cyclopentadienyl derivatives which form the constrained ligand geometry.

The activating co-catalyst can be methyl aluminoxane (MAO), a trialkyl aluminum, a dialkyl aluminum, a salt of an inert and non-coordinating anion, or a mixture thereof. Illustrative of trialkyl aluminum includes trimethyl aluminum, triethyl aluminum, tripropyl aluminum, triisopropyl aluminum, tributyl aluminum, and triisobutyl aluminum (TIBA). The salt of an inert and non-coordinating anion can be borates. Borates suitable for use in the present invention include N,N-dimethyl anilinium tetrakis (pentafluorophenyl)-borate, triphenyl carbenium tetrakis (pentafluorophenyl)-borate, trimethyl ammonium tetrakis (pentafluorophenyl)borate, ferrocenium tetrakis (pentafluorophenyl)borate, dimethyl ferrocenium tetrakis (pentafluorophenyl)borate, and silver tetrakis (pentafluorophenyl)borate. Preferably, the activating co-catalyst is methyl aluminoxane, or a mixture of a trialkyl aluminum and a borate. Suitable diluents for the polymerization reaction include aliphatic and aromatic hydrocarbons such as propane, butane, pentane, cyclopentane, hexane, toluene, heptane, iso-octane, and the like, which can be used individually or collectively.

In general, the polymerization reaction is carried out by mixing styrene and p-methylstyrene in the presence of the catalyst in a co-polymerization reactor, with thorough mixing at a temperature between 0° C. to 100° C. The polymerization is carried out under an inert gas atmosphere in absence of moisture.

In the styrene/p-methylstyrene copolymer, the benzylic protons in p-methylstyrene unit can be easily converted to various functional groups, such as carboxyl or acid anhydride, amino, hydroxyl or epoxy, under mild reaction conditions. Examples of the carboxyl or acid anhydride include, without limitation, maleic acid, maleic anhydride, acrylic acid, methacrylic acid, citraconic anhydride, itaconic acid, itaconic anhydride, cis-4-cyclohexene-1,2-dicarboxylic acid, cis-4-cyclohexene-1,2-dicarboxylic anhydride or endo-bi-cyclo-2,2,2,1,-5-heptene-2,3-dicarboxylic anhydride. Examples of the epoxy include, without limitation, glycidyl ether, methacrylic acid glycidyl ether, glycidyl methacrylate or acrylic acid glycidyl ether. Most functionalization reactions of benzylic protons in organic compounds can be applied to those of benzylic protons in p-methylstyrene. With regard to the functionallization of benzylic protons, references are made to U.S. Pat. No. 5,543,484 (Chung, et al.); U.S. Pat. No. 5,548,029 (Powers et al.); and U.S. Pat. No. 5,162,445 (Powers, et al.).

In the resin composition according to the present invention, a mixture of epoxy resins is employed as the component (b). The mixture comprises: (b1) 10–90 parts by weight of bisphenol polyglycidyl ether; and (b2) 90–10 parts by weight of epoxidized novolak resin, wherein the epoxy equivalent weight of bisphenol polyglycidyl ether ranges from 160 to 4,000, preferably from 180 to 200; the component (b1) used in the invention has the following structure:

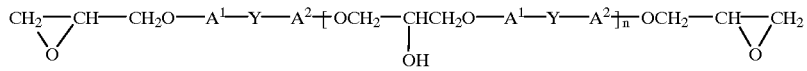

wherein:
each of $A^1$ and $A^2$ is a monocyclic divalent aromatic radical; and
Y is a substituted hydrocarbon radical used for separating $A^1$ and $A^2$.
The $A^1$ and $A^2$ described above are unsubstituted phenylene or substituted derivatives, wherein the substituent of the derivatives includes, without limitation, alkyl, nitro or alkoxy. Y is a substituted hydrocarbon radical includes, without limitation, methylene, cyclohexylmethylene, ethylene, isopropylidene, neopentylidene, cyclohexylidene or cyclopentadecyidene, wherein the substituent is selected from the group consisting of hydrocarbons, oxy, sulfoxy and sulfone.

In the resin composition according to the present invention, a curing agent is employed as the component (c). The curing agent includes, without limitation, aromatic amine, sec-amine, tert-amine, anhydrous acid or dicyandiamide.

The resin composition according to the present invention can further comprises a curing accelerating agent such as boron trifluoride-amine complex.

The resin composition according to the present invention can also further comprises a filler, such as flame retardants, flame retardant aids, or combinations thereof.

According to another object of the invention, there is also provided a laminate for an electric circuit board, which comprises a sheet made from the resin composition as set forth above being laminated with a glass cloth. The mixture of epoxy resins containing the above-described components (i.e. (b1) and (b2)) is dissolved into a colloidal solution first, and then the f-sPS is dissolved in the colloidal solution. Afterward, a glass cloth is impregnated, and the resulting prepreg is then heated, laminated to form a printed circuit board.

According to the preferred embodiment of the invention, the laminate produced thereby exhibited an excellent dielectric constant of 3.1 at 1 GHz. Due to the similar processing, the traditional raw material, polyphenylene oxide, can be replaced to f-sPS, and the resulting electric circuit board has the advantages of low dielectric constant and increased solvent resistance.

Without intending to limit it in any manner, the present invention will be further illustrated by the following examples.

EXAMPLE

Bisphenol A polyglycidyl ether (DOW Co.; Cat. No. DER-331) and epoxidized novolak resin (DOW Co.; Cat. No. DEN-438) were added to butanone (Aldrich Co.), and stirred for 10–15 min at room temperature to dissolve epoxy resin thoroughly. The f-sPS was added to the epoxy resin solution described above, and stirred to dissolve f-sPS thoroughly. The curing agent, diamino diphenyl sulfone (DDS), and the curing accelerating agent, boron trifluoride-monoethylamine ($BF_3$-MEA), were added to the solution described above, and stirred to disperse sufficiently. A prepreg was prepared by impregnating a glass cloth (local company; Cat. No. E-glass, 2116) with the colloidal solution described above. The impregnated glass cloth was planarized with a glass rod before the solution was dried. The prepreg obtained in the foregoing was heated in an oven at 90–130° C. for 10–30 min, then subjected to compression molding at 160–320° C. for 180–360 minutes. The laminate thus obtained was measured for the dielectric properties. The results of the measurements are shown in Table 1.

TABLE 1

The dielectric constants of electric circuit boards made from different composition.

|  | $A_1$ |  | $A_2$ |  | $A_3$ |  | $A_4$ |  |
|---|---|---|---|---|---|---|---|---|
| Mixture of epoxy resins[1] | 100[2] |  | 100 |  | 100 |  | 100 |  |
| f-sPS | 0 |  | 100 |  | 100 |  | 20 |  |
| Curing agent | 30 |  | 30 |  | 30 |  | 30 |  |
| Curing accelerating agent | 1 |  | 1 |  | 0 |  | 1 |  |
| Glass cloth[3] | − | + | − | + | − | + | − | + |
| $D_k$[4] (at 1 GHz) | 3.6 | 4.5 | 2.9 | 3.1 | 3.5 | 4.2 | 3.0 | 3.1 |

[1] The mixture of epoxy resins was composed of 70% of bisphenol A and 30% of novolak.
[2] The numbers denote parts by weight.
[3] −/+ denotes without/with glass cloth respectively.
[4] $D_k$ denotes dielectric constant.

The trial $A_1$ can be served as a comparative example: the dielectric constant increased apparently without f-sPS, (in comparison with trial $A_1$ and $A_2$). Accordingly, as can be seen in trial $A_4$, even the amount of f-sPS decreased to 20 parts by weight, the result shows no significant difference (in comparison with trial $A_2$ and $A_4$).

As compared with PPO ($D_k$ is 2.7 at 1 GHz) and PTFE ($D_k$ is 2.2 at 1 GHz) which are commercially available, the f-sPS of the present invention shows a similar dielectric property ($D_k$ is 2.4 at 1 GHz); After adding epoxy resins, the PPO/epoxy resin (commercial product GETEK; GE Co.) has the dielectric constant of 4.0 at 1 GHz, and the f-sPS/epoxy resin of the invention has the dielectric constant of 3.1 at 1 GHz. Therefore, the resin composition of the present invention has the both advantages of reducing dielectric constant and increasing solvent resistance.

While the invention has been particularly shown and described with the reference to the preferred embodiment thereof, it will be understood by those skilled in the art that various changes in form and details may be made without departing from the spirit and scope of the invention.

What is claimed is:

1. A resin composition for electric circuit boards, comprising:
   (a) 20–99.9 parts by weight of a carboxyl or acid-anhydride functionalized syndiotactic styrene/para-alkylstyrene copolymer having microfoaming when being cured;
   (b) 0.01–80 parts by weight of a mixture of epoxy resins; and
   (c) a minimum amount effective to cure said composition to less than 50 parts by weight of a curing agent selected from the group consisting of an aromatic polyamine, a secondary amine, a tertiary amine, a polycarboxylic acid anhydride and dicyandiamide.

2. The resin composition as claimed in claim 1, wherein said functionalized syndiotactic styrene/para-alkylstyrene copolymer is obtained from the co-polymerization with a compound containing a group of carboxyl or acid anhydride, amino, hydroxyl or epoxy.

3. The resin composition as claimed in claim 2, wherein said functionalized syndiotactic styrene/para-alkylstyrene copolymer has a weight-average molecular weight ranging from $1 \times 10^4$ to $5 \times 10^5$.

4. The resin composition as claimed in claim 2, wherein said compound containing said group of carboxyl or acid anhydride is selected from the group consisting of maleic acid, maleic anhydride, acrylic acid, methacrylic acid, citraconic anhydride, itaconic acid, itaconic anhydride, cis-4-cyclohexene-1,2-dicarboxylic acid, cis-4-cyclohexene-1,2-dicarboxylic anhydride and endo-bi-cyclo-2,2,2,1,-5-heptene-2,3-dicarboxylic anhydride.

5. The resin composition as claimed in claim 1, wherein said mixture of epoxy resins comprises:
   (b1) 10–90 parts by weight of a bisphenol polyglycidyl ether; and
   (b2) 90–10 parts by weight of epoxidized novolak resin.

6. The resin composition as claimed in claim 5, wherein said bisphenol polyglycidyl ether has an epoxy equivalent weight ranging from 160 to 4,000.

7. The resin composition as claimed in claim 6, wherein said bisphenol polyglycidyl ether has an epoxy equivalent weight ranging from 180 to 200.

8. The resin composition as claimed in claim 5, wherein said bisphenol polyglycidyl ether has the following structure:

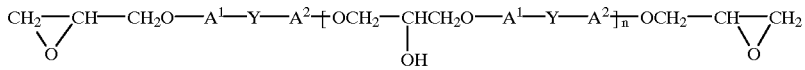

wherein
   each of $A^1$ and $A^2$ is a divalent monocyclic aromatic radical;
   n is 0–4; and
   Y is substituted hydrocarbon radical used for separating $A^1$ and $A^2$.

9. The resin composition as claimed in claim 8, wherein said $A^1$ and $A^2$ are unsubstituted phenylene or substituted derivatives, wherein the substituent of the derivatives is selected from the group consisting of alkyl, nitro and alkoxy.

10. By The resin composition as claimed in claim 8, wherein said Y is a substituted hydrocarbon radical which selected from the group consisting of methylene, cyclohexylmethylene, ethylene, isopropylidene, neopentylidene, cyclohexylidene and cyclopentadecyidene, wherein the substituent is selected from the group consisting of hydrocarbons, oxy, sulfoxy and sulfone.

11. The resin composition as claimed in claim 1, which further comprises a filler, wherein said filler is selected from the group consisting of flame retardants, flame retardant aids, and combinations thereof.

12. The resin composition as claimed in claim 1, which further comprises a curing accelerating agent.

13. A laminate for printed circuit board, comprising a sheet made from the resin composition as set forth in claim being laminated with a glass cloth.

14. The laminate as claimed in claim 13, wherein said glass cloth is impregnated with said functionalized syndiotactic styrene/para-alkylstyrene copolymer having microfoaming when being cured, and said mixture of epoxy resins as set forth in claim 1.

15. The laminate as claimed in claim 13, which has a dielectric constant of not greater than 3.1 at 1 GHz.

* * * * *

UNITED STATES PATENT AND TRADEMARK OFFICE
CERTIFICATE OF CORRECTION

PATENT NO.    : 6,388,009 B1
DATED         : May 14, 2002
INVENTOR(S)   : Wei Han Liao, Hsein-Yin Tsai and In-Mau Chen It is certified that error appears in the above-identified patent and that said Letters Patent is hereby corrected as shown below:

<u>Title page,</u>
Please add Item [30] Foreign Application Priority Data and add
-- Oct. 4, 1999 (TW) ............. 088117049 --.

Signed and Sealed this

Twenty-second Day of October, 2002

Attest:

Attesting Officer

JAMES E. ROGAN
Director of the United States Patent and Trademark Office